(12) United States Patent
Schulz-Harder (10) Patent No.: US 8,481,842 B2
(45) Date of Patent: Jul. 9, 2013

(54) PROCESS FOR PRODUCING PELTIER MODULES, AND PELTIER MODULE

(75) Inventor: Jürgen Schulz-Harder, Lauf (DE)

(73) Assignee: Curamik Electronics GmbH, Eschenbach (DE)

( * ) Notice: Subject to any disclaimer, the term of this patent is extended or adjusted under 35 U.S.C. 154(b) by 455 days.

(21) Appl. No.: 12/224,362

(22) PCT Filed: Feb. 20, 2007

(86) PCT No.: PCT/DE2007/000342
§ 371 (c)(1),
(2), (4) Date: Dec. 22, 2008

(87) PCT Pub. No.: WO2007/098736
PCT Pub. Date: Sep. 7, 2007

(65) Prior Publication Data
US 2009/0272417 A1    Nov. 5, 2009

(30) Foreign Application Priority Data

Mar. 1, 2006 (DE) .......................... 10 2006 009 821
Mar. 13, 2006 (DE) .......................... 10 2006 011 743

(51) Int. Cl.
*H01L 35/34* (2006.01)
*H01L 35/28* (2006.01)
*H01L 21/00* (2006.01)

(52) U.S. Cl.
USPC .................. 136/203; 136/201; 257/E21.211; 438/55

(58) Field of Classification Search
USPC .................................................. 136/201, 203
See application file for complete search history.

(56) References Cited

U.S. PATENT DOCUMENTS

| 3,301,714 | A |   | 1/1967  | Lyman, Jr. |        |
|-----------|---|---|---------|-----------------------|--------|
| 3,707,429 | A |   | 12/1972 | Saunders |        |
| 5,409,547 | A | * | 4/1995  | Watanabe et al. | 136/204 |
| 5,929,351 | A |   | 7/1999  | Kusakabe et al. |        |
| 5,987,893 | A | * | 11/1999 | Schulz-Harder et al. | 136/204 |
| 6,127,619 | A |   | 10/2000 | Xi et al. |        |
| 6,172,294 | B1| * | 1/2001  | Tsuno et al. | 136/201 |
| 6,759,586 | B2| * | 7/2004  | Shutoh et al. | 136/205 |
| 2004/0042181 | A1 |   | 3/2004 | Nagasaki |        |
| 2006/0017170 | A1 |   | 1/2006 | Chen et al. |        |

FOREIGN PATENT DOCUMENTS

DE      19527867       1/1997
DE    102005030591     1/2006

(Continued)

OTHER PUBLICATIONS

Hopkins et al. "Thermal Performance Comparison and Metallurgy of Direct Copper Bonded AlN, Al2O3, and BeO Assemblies" 1992, ISHM '92 Proceedings, pp. 577-583.*

*Primary Examiner* — Jonathan Johnson
*Assistant Examiner* — Andrew Golden
(74) *Attorney, Agent, or Firm* — Welsh Flaxman & Gitler LLC (57) ABSTRACT

The invention relates to a method for producing Peltier modules, each of which comprises several Peltier elements that are arranged between at least two substrates. The substrates are made of an electrically insulating material at least on the sides facing the Peltier elements while being provided with contact areas on said surfaces. The contact areas, to which the Peltier elements are connected by means of terminal sure during the production process, are formed by metallic areas.

15 Claims, 8 Drawing Sheets

FOREIGN PATENT DOCUMENTS

| | | |
|---|---|---|
| EP | 0 821 417 | 1/1998 |
| EP | 0 827 215 | 3/1998 |
| EP | 1 079 445 | 2/2001 |
| JP | 10 074986 | 3/1998 |
| JP | 2003 332644 | 11/2003 |
| JP | 2004 273489 | 9/2004 |

* cited by examiner

PROCESS FOR PRODUCING PELTIER MODULES, AND PELTIER MODULE

BACKGROUND OF THE INVENTION

The invention relates to a for producing Peltier modules located between two substrates and to a Peltier module produced therefrom.

The production of Peltier modules according to the process which has been conventional to date is complex. Furthermore these Peltier modules do not have optimum thermal properties.

Producing the metal coating required for producing printed conductors, terminals, etc on a ceramic, for example on an aluminum oxide ceramic layer, using the so-called DCB (direct copper bond technology) process, specifically using metal or copper foils or metal or copper sheets which form the metal coating and which have on their surface sides a layer or a coating (fused layer) of a chemical compound of a metal and a reactive gas, preferably oxygen, is known. In this process which is described for example in U.S. Pat. No. 3,744,120 or in DP-PS 23 19 854, this layer or this coating (fused layer) forms a eutectic with a melting point below the melting point of the metal (for example, copper) so that by placing the foil on the ceramic and by heating all the layers they can be joined to one another by fusing the metal or the copper essentially only in the region of the fused layer or oxide layer.

This DCB process then has for example the following process steps:
  oxidation of a copper foil such that a uniform layer of copper oxide results;
  placing the copper foil on the ceramic layer;
  heating the combination to a process temperature between roughly 1025 to 1083° C., for example to roughly 1071° C.;
  cooling to room temperature.

Furthermore, the so-called active solder process (DE 22 13 115; EP-A-153 618) for joining metal layers or metal foils which form the metal coatings, especially also copper layers or copper foils to the respective ceramic material, is known. In this process which is used especially also to produce metal ceramic substrates, at a temperature between roughly 800-1000° C. a connection between a metal foil, for example copper foil, and a ceramic substrate, for example aluminum nitride ceramic, is produced using a brazing solder which in addition to the main component, such as copper, silver, and/or gold, also contains an active metal. This active metal, which is for example at least one element of the group Hf, Ti, Zr, Nb, Ce, by a chemical reaction produces a connection between the solder and the ceramic, while the connection between the solder and the metal is a metallic brazing solder connection.

It is an object of the invention is to devise a process with which simplified production of Peltier modules is possible.

SUMMARY OF THE INVENTION

In the invention the connection of at least one part of the Peltier element at least on one terminal side to the contact surfaces of the substrate takes place directly, and preferably according to one general embodiment of the invention by sinter bonding via at least one sinter layer or according to a further general embodiment of the invention in that when the respective Peltier element is produced for example by sintering, this element is sintered onto the contact surface of the substrate. In both cases the connection of the pertinent Peltier element to the contact surface takes place by sintering or by sinter bonding, for example directly on the metal region (metal layer or copper layer) which forms the contact surface or using at least one intermediate layer between the metal region and the respective Peltier element.

One advantage of the invention lies on the one hand in the greatly simplified production of Peltier modules, but on the other also in that the thermal conductivity of the transition between the Peltier elements and the substrates at least on the direct connections or on the connections which have the sinter layer as the connecting layer is greatly increased and thus the thermal properties and action of the respective Peltier module are greatly improved.

BRIEF DESCRIPTION OF THE DRAWINGS

The invention is detailed below using the figures in embodiments.

DETAILED DESCRIPTION OF THE INVENTION

Figure 1:
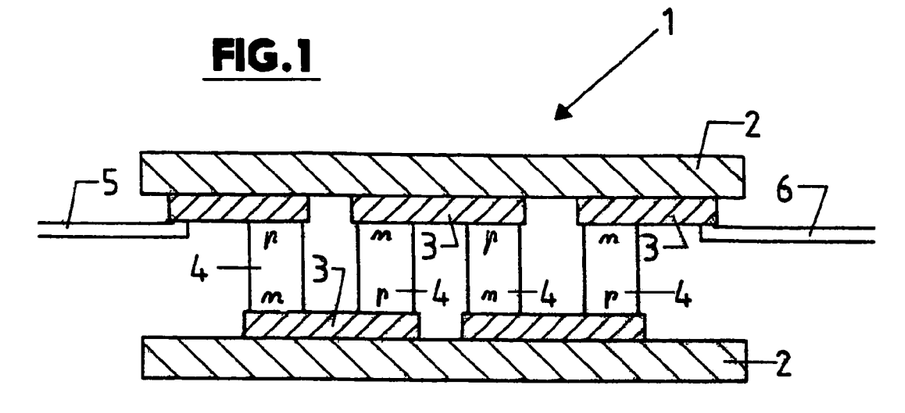
FIG. 1 shows in a schematic and in a side view the structure of a Peltier module.

FIG. 1 shows in a simplified representation a Peltier module which consists in the conventional manner of two plate-shaped ceramic substrates 2 which on their facing surface sides are each provided with a structured metal coating which forms a plurality of contact surfaces 3.

Between the contact surfaces 3 there are several Peltier chips or Peltier elements 4 such that these Peltier elements 4 lie electrically in series with reference to the outer terminals 5 and 6 of the Peltier module. For this purpose, the Peltier elements 4 with their two terminal sides are connected not only each to one contact surface 3 on the ceramic substrate which is the upper one in FIG. 1 and on the ceramic substrate which is the lower one in FIG. 1, but Peltier elements 4 adjacent to one another are also connected to one another via each contact surface 3 on each ceramic substrate 2, as is fundamentally known to one skilled in the art for Peltier modules.

FIG. 1 shows for the sake of simplification only one row with a total of four Peltier elements 4. But in fact, this Peltier module, perpendicular to the plane of the drawing of FIG. 1, also has a plurality of Peltier elements 4 in several rows and columns, then all the Peltier elements 4 being arranged electrically in series between the terminals 5 and 6 and with respect to their polarity being oriented such that current flow through all the Peltier elements between the terminals 5 and 6 is possible.

Figure 2:
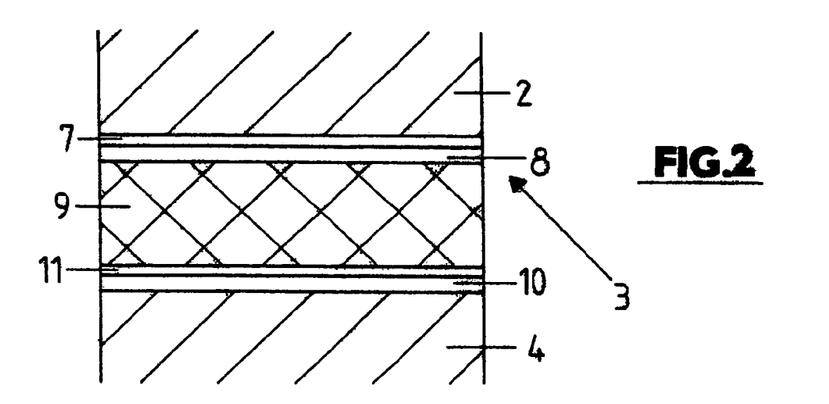
FIGS. 2 and 3 each show in a simplified representation a multilayer transition between a Peltier chip and a contact surface which is formed on the ceramic substrate according to the prior art.

FIG. 2 shows a connection between the ceramic substrate 2 and one terminal side of a Peltier element 4, as is conventional in Peltier modules. To produce the contact surfaces 3, first by means of paste printing, structured layer of a paste containing molybdenum, manganese and/or tungsten in a paste containing a powder form, which layer corresponds to the arrangement of the contact surfaces 3, is applied and fired in a reducing atmosphere at a temperature exceeding 1100° C. The layer 7 which has been produced in this way and which is structured according to the contact surfaces 3 is then nickel-plated, for example in a chemical process. Since in any case the layer 7 does not have sufficiently high conductivity or a large enough cross section for the relatively large currents with which a Peltier module is operated, metal regions 9 in the form of copper plates are soldered onto the nickel-plated layer 7 by means of a soft solder 8 and the copper plates are then soldered to the Peltier elements 4 using a soft solder (solder layer 10). In order to prevent diffusion of copper into the respective Peltier element, an additional nickel layer 11 between the solder layer and the respective copper plate 9 is necessary. Aside from the fact that such a known connection between the ceramic substrate 2 and the respective contact surface 3 which has been formed essentially by the copper plate 9, and the connection between this contact surface and the Peltier element are complex to produce, this connection has unsatisfactory thermal conductivity, by which the action of the pertinent Peltier element is greatly reduced.

Figure 3:
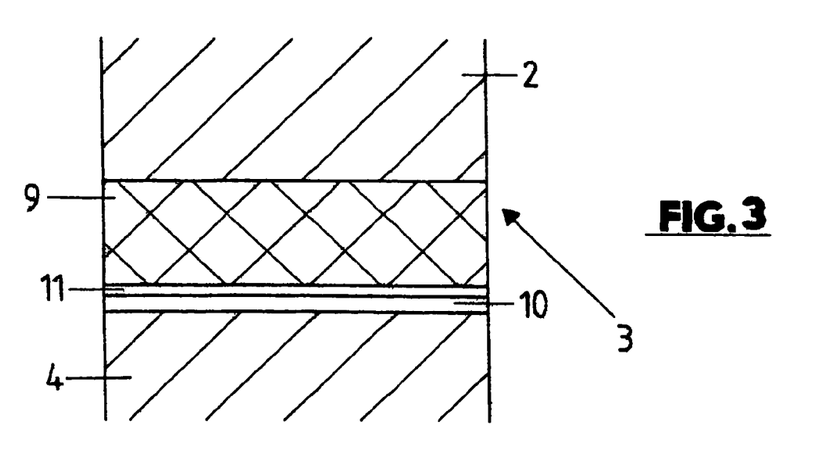

FIG. 3 shows in a schematic the structure of a connection between the ceramic substrate 2 and the respective Peltier element 4 in another known version, in which the contact surfaces 3 are formed by a structured metal coating which is applied directly to the ceramic substrate 2 with the known direct bonding process. The metal coating which forms the contact surfaces 3 is formed for example by one copper or copper alloy foil at a time which then after joining to the respective ceramic substrate 2 has been structured using conventional techniques, for example using the masking-etching technique, into the individual contact surfaces 3. In this known version however the Peltier elements 4 are again also connected to the contact surfaces 3 which are provided with the nickel layer 11 via the soft solder layer 10. The DCB connection between the contact surfaces 3 and the respective ceramic substrate 2 does improve the thermal behavior of the pertinent Peltier module, but the soft solder layer 10 continues to be disadvantageous.

Figure 4:
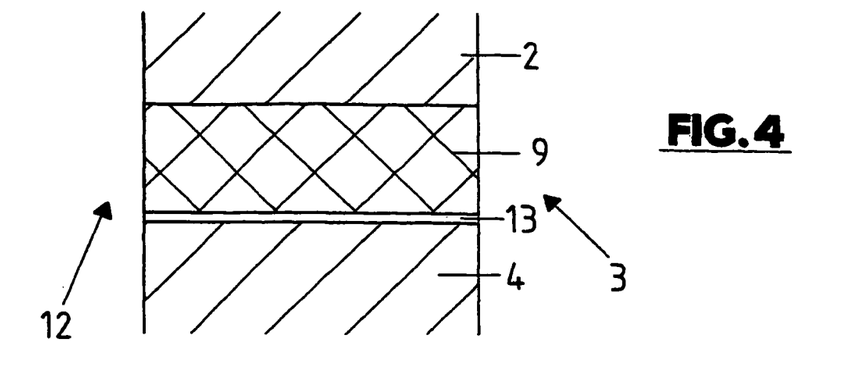
FIGS. 4-13 each show different transitions or connections between a contact surface which has been applied on a ceramic substrate using the DCB technique and a Peltier chip as claimed in the invention.

FIG. 4 shows a connection as claimed in the invention which is generally labelled 12 in this figure, between a contact surface 3 and a Peltier element 4. The contact surface 3 in this embodiment is formed by metal regions 9 of a structured metal coating, for example a structured foil of copper or a copper alloy which is joined two-dimensionally to the ceramic substrate 2 by means of the DCB process. The ceramic substrate 2 is for example an aluminum oxide ceramic ($Al_2O_3$), an aluminum oxide ceramic with additives of zirconium oxide ($Al_2O_3+ZrO_2$), an aluminum oxide ceramic (AlN) or a silicon nitride ceramic ($Si_3N_4$). The thickness of the ceramic substrate 2 is for example in the range between 0.2 and 1.2 mm. The thickness of the metal coating which forms the contact surfaces 3 is for example in the range between 0.1 and 1.0 mm.

The contact surfaces 3 are connected to the terminal side of the respective Peltier element 4 for example via an intermediate layer 13 of nickel with a thickness in the range between 1 and 10 microns (to prevent diffusion of copper onto the Peltier element 4). But fundamentally the intermediate layer 13 could be omitted. The particularity of the connection 12 consists in that it is produced directly between the Peltier element 4 and the contact surface 3, without using a soft solder, etc.

Figure 5:
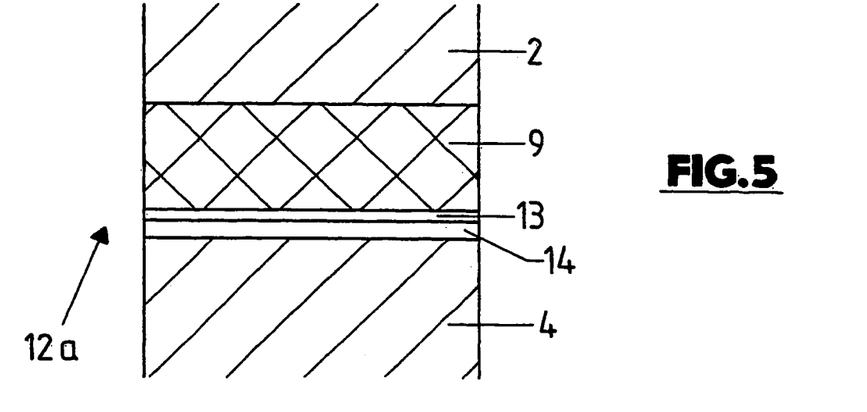

FIG. 5 shows as another possibility another connection 12a which differs from the connection 12 essentially only in that between the intermediate layer 13 of nickel and the Peltier element 4 there is still another intermediate layer 14 of gold with a thickness between 0.01 and 1.5 microns.

Figure 6:
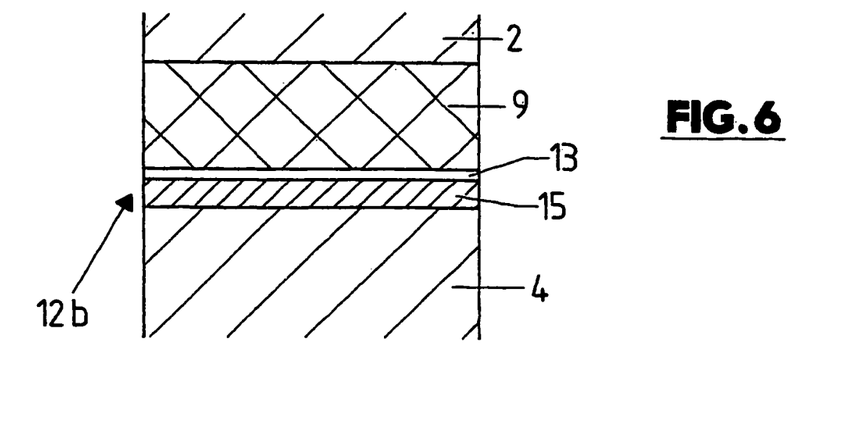

FIG. 6 shows a connection 12b which differs from the connection 12 in that between the intermediate layer 13 of nickel and the terminal side of the Peltier element 4 there is a sinter layer 15 of a metallic sinter material via which the Peltier element is electrically and thermally connected to the respective contact surface 3 or to the intermediate layer 13 of this contact surface. The sinter layer 15 is made such that it has a thickness in the range between 10 and 20 microns. Metallic sinter materials, for example copper, silver, alloys of copper and silver, are suited for this sinter layer. In addition, the sinter material can also contain other components, especially those which increase sinterability and/or which reduce the sintering temperature. For example, tin is one such component.

The sinter layer 15 and thus the connection between the Peltier element 4 and the contact surface 3 is for example by applying the powdered sinter material or a dispersion or nano-dispersion containing this material to one of the surfaces to be joined and by subsequent heating to the sintering temperature and at a given sintering pressure, for example to a sintering temperature which is below the melting point of the Peltier substance which forms the respective Peltier element.

Figure 7:
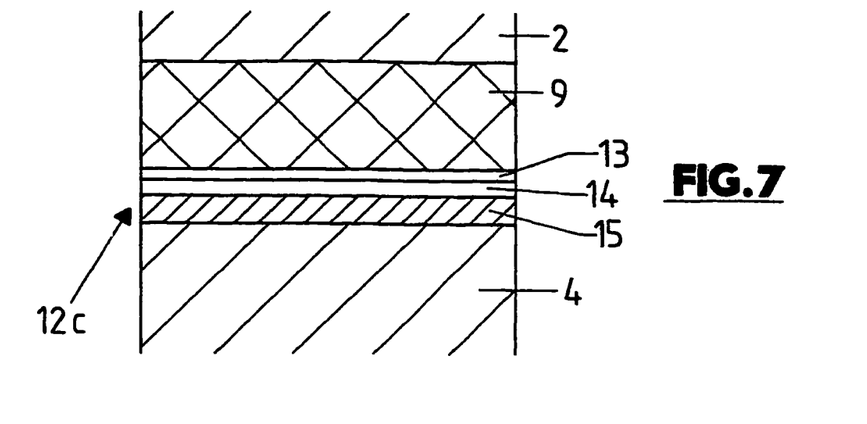

FIG. 7 shows as another possible embodiment a connection 12c which differs from the connection 12b simply in that between the nickel intermediate layer 13 and the sinter layer 15 there is an intermediate layer 14 of gold, in this embodiment the nickel layer in turn having a layer thickness in the range between 1-10 microns and the gold layer having a thickness in the range between 0.01 and 15 microns.

Figure 8:
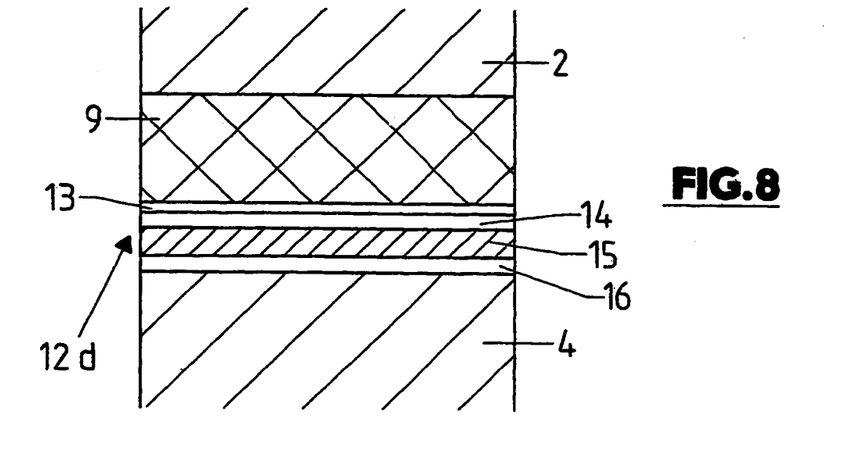

FIG. 8 shows as another embodiment a connection 12d which differs from the connection 12c in that between the sinter layer 15 and the Peltier element 4 there is another intermediate layer 16 of nickel which for example has a thickness between 1 and 10 microns.

Figure 9:
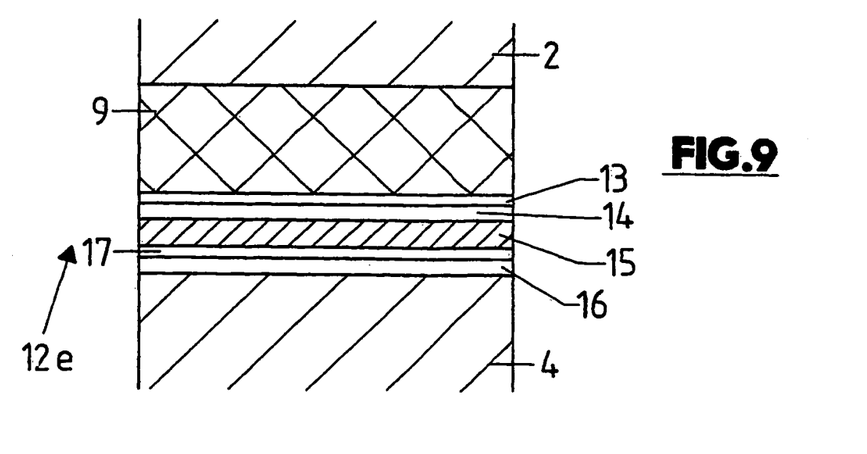

FIG. 9 shows a connection 12e which differs from the connection 12d in that between the nickel intermediate layer 16 and the sinter layer 15 there is an intermediate layer 17 of gold which for example has a thickness in the range between 0.01 and 1.5 microns.

Figure 10:
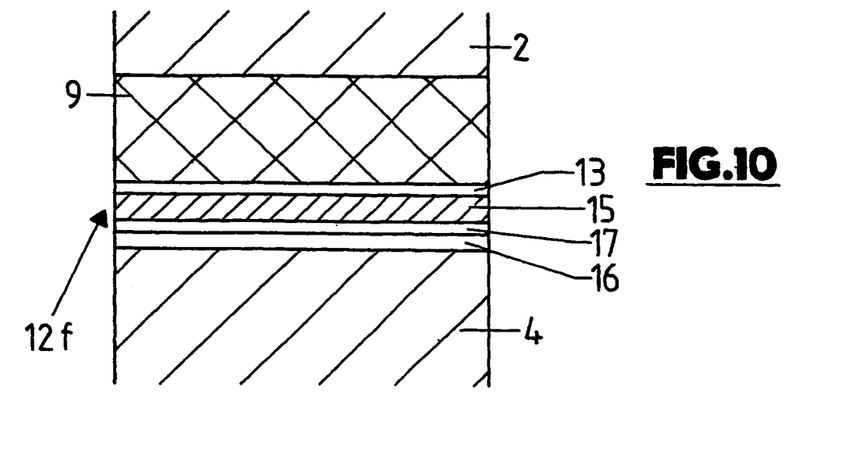

FIG. 10 shows a connection 12f which corresponds to the connection 12e, in any case the gold intermediate layer 14 being omitted.

Figure 11:
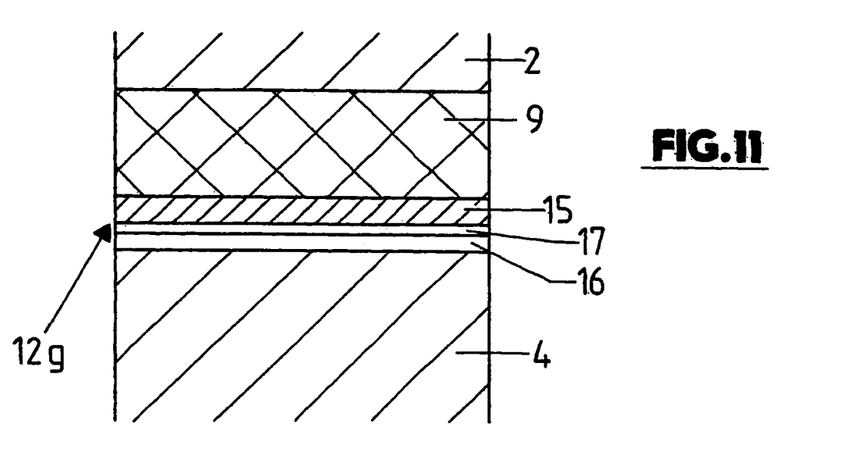

FIG. 11 shows a connection in which the nickel intermediate layer 13 is omitted, the sinter layer 15 therefore directly adjoins the respective contact surface 3 or the metal region 9 which forms the latter.

Figure 12:
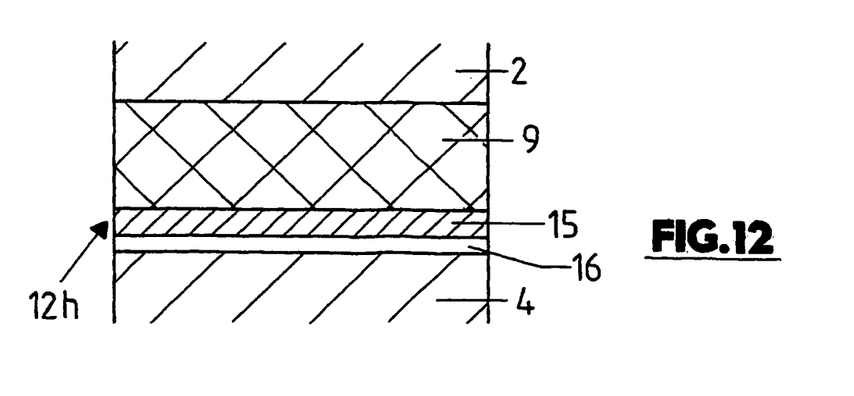

FIG. 12 shows a connection 12h which differs from the connection 12g in that the gold intermediate layer 17 is omitted.

Figure 13:
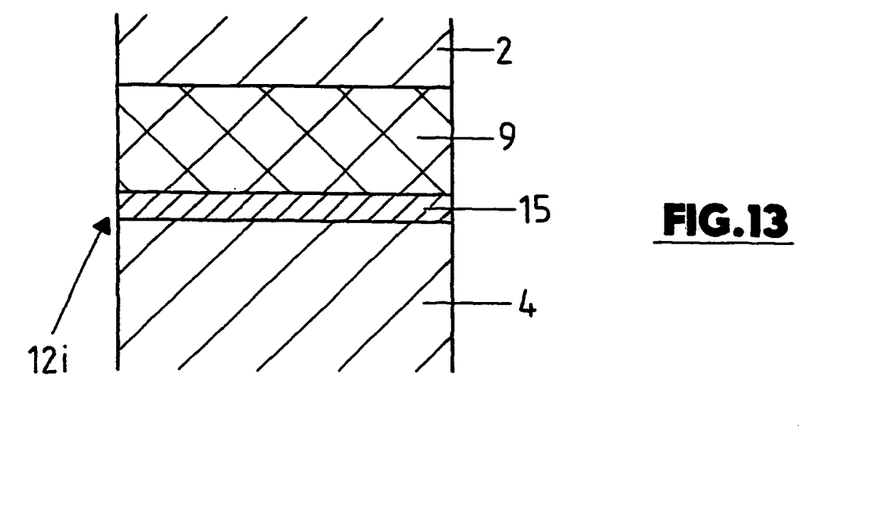

FIG. 13 finally shows a connection 12i in which the respective contact surface 3 directly adjoins the Peltier element 4 via the sinter layer 15.

Figure 14:
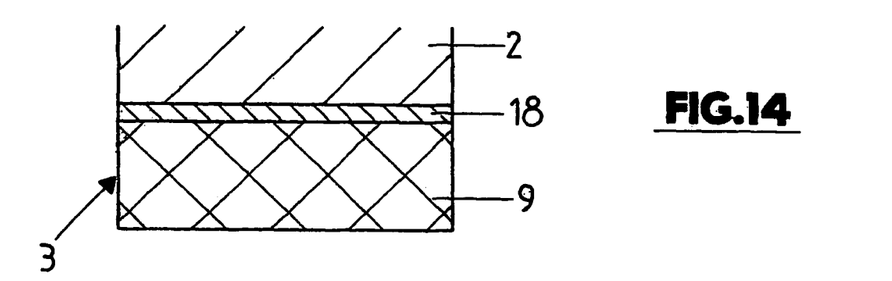
FIG. 14 shows the connection between the ceramic substrate and a metal or copper region (copper pad) which forms a contact surface, produced using the active soldering process.

While in the embodiments of FIGS. 4-13, the contact surfaces 3 and the metal regions 9 are each formed by structured metal coatings 3 applied to the respective ceramic substrate 2 with the DCB process, according to FIG. 14 it is also possible to connect the metal coating which forms the contact surfaces 3 and the metal regions 9 to the respective ceramic substrate by active soldering, i.e. via an active solder layer 18. The active solder layer 18 then contains in the manner known to one skilled in the art an alloy which is suited as brazing solder, for example a copper-silver alloy with an active solder component, for example titanium, hafnium, zirconium. The thickness of the active solder layer is then for example in the region between 1 and 20 microns. The contact surfaces 3 connected to the respective ceramic substrate 2 by active soldering can then be connected to the respective Peltier element likewise by way of the most varied connections, for example by way of connections 12, 12a-12i.

Figure 15:
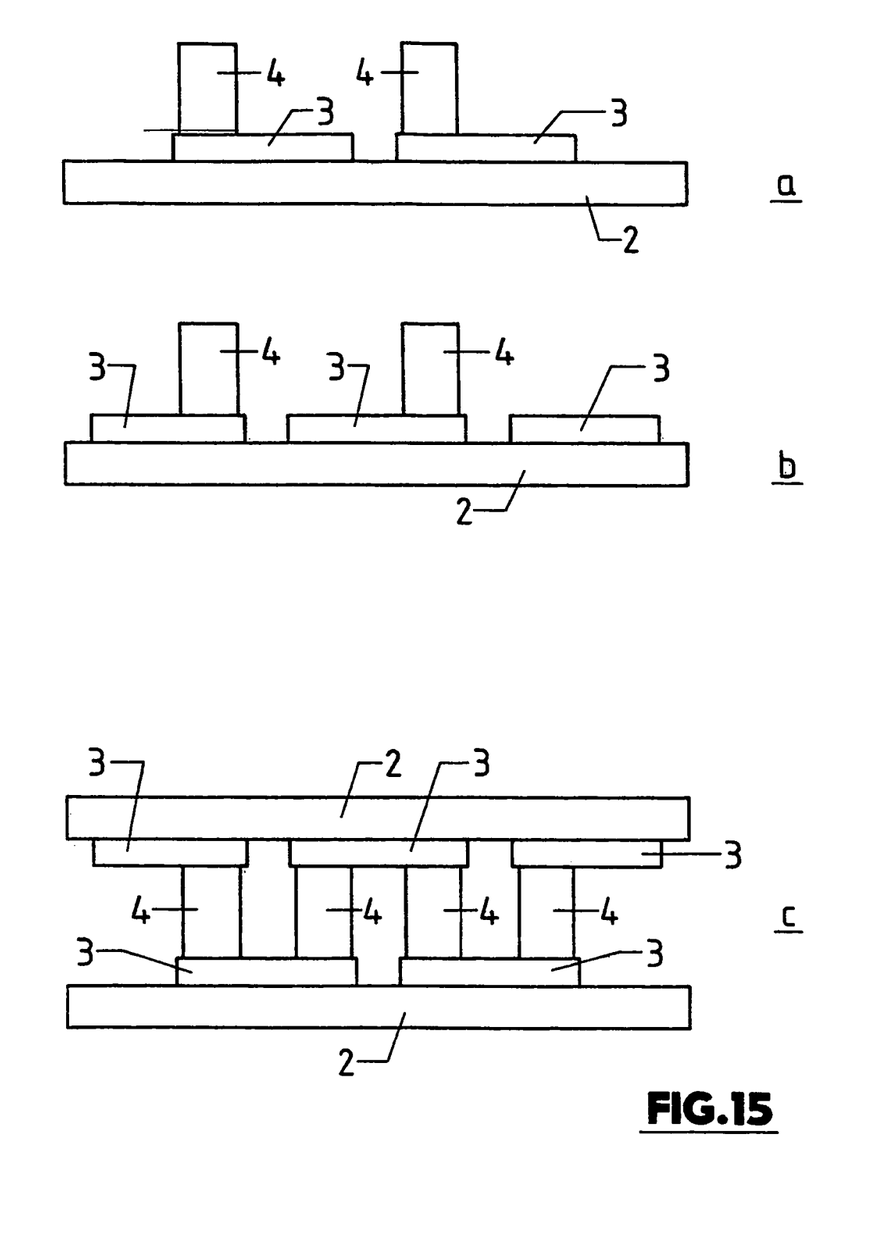
FIG. 15 shows different steps of production of a Peltier module.

Production of the Peltier modules 1 with the prescribed transitions 12, 12a-12i takes place more in detail for example according to FIG. 15 such that a Peltier wafer produced in a suitable manner is divided into individual Peltier elements 4 and these elements are then attached to the contact surfaces 3 of the ceramic substrates 2 via one of the connections 12 or 12a-12i such that there is a Peltier element 4 over the pertinent connection on each contact surface 3, and specifically on all contact surfaces 3 of one ceramic substrate 2 at a time, in the same electrical orientation or with the same pole. Two ceramic substrates at a time which are shown in FIG. 15 in positions a and b and which are equipped beforehand with the Peltier elements 4 are then placed on one another according to position c of FIG. 15 so that the Peltier elements 4 lie electrically in series over the contact surfaces 13. By a solder layer 19 which has been applied to the free ends or terminal sides of the Peltier elements 4, the Peltier elements 4 are connected on each ceramic substrate 2 with their terminal sides with which no contact has been made and which are exposed by then mechanically and electrically to one contact surface 3 at a time on the ceramic substrate 2 which is the other one at the time. Between the solder layer 15 and the Peltier element 4 there is at least one intermediate layer 20, for example a nickel layer. There is at least one other intermediate layer 21, for example a nickel layer, between the solder layer 15 and the respective contact surface 3.

The application of the intermediate layers 20 and other intermediate layers, for example the intermediate layers 13, 16 and 17 to the Peltier elements 4, takes place for example after cutting the Peltier wafers into individual Peltier elements 4 using suitable processes, for example electrolytically and/or by chemical deposition. Among others, for intermediate layers of silver it is possible to produce these layers by applying a dispersion which contains the material of the intermediate layer, for example a nanodispersion or a corresponding paste, for example by printing using screens, printing masks or templates.

Ceramic substrates are produced in the versions of FIGS. 4-13 such that using the DCB process a metal coating in the form of a copper foil is applied to at least one surface side of the respective ceramic layer or of the respective ceramic substrate 2 and this coating is then structured by a suitable technique, for example a masking and etching technique, into the individual metal regions 9 which form the contact surfaces 3 and pads.

The application of individual intermediate layers, for example the intermediate layers 13 and 14, takes place for example galvanically and/or by chemical deposition. Among others, for intermediate layers of silver it is possible to produce these layers by applying a dispersion which contains the material of the intermediate layers, for example nanodispersions or a corresponding paste, for example by printing using screens, printing masks or templates.

In the version of FIG. 14, after applying the metal coating which forms the contact surfaces 3 in the form of a metal foil or copper foil using active soldering or the active solder layer 18, in turn with suitable measures (for example masking and etching technique) the structuring of the metal coating into the individual metal regions 9 which form the contact surfaces 3 takes place, whereupon then optionally one or more intermediate layers are applied to these metal regions 9, in turn by galvanic or chemical deposition and/or application of a dispersion which contains the metal of the intermediate layer in powder form (for example also a nanodispersion) or paste by printing on, for example using screens or printing masks or using templates.

The joining of the Peltier elements 4 provided on the joining or connecting surfaces or terminal sides without an intermediate layer or with one or more intermediate layers on the contact surfaces 3 which are likewise without an intermediate layer or are provided with one or more intermediate layers, takes place in the versions of FIGS. 6-13 via the sinter layer 15. For this purpose, the metallic sinter material in powder form, for example as a dispersion or nanodispersion, is applied to at least one of the surfaces to be connected.

Then the connecting sintering layer 15 is produced at the sintering temperature and under the sintering temperature.

The sintering temperature here is below the melting point of the material of the Peltier elements 4, for example 30 to 50° C. below this melting point, but is at least 120° C. But fundamentally it is also possible to execute this sinter bonding in a presintering phase first without pressure, specifically until a layer with closed pores has been formed from the sinter material, and that then sintering takes place at the sintering temperature and for example with increased sintering pressure. The respective sinter layer is produced such that its thickness is for example in the region between 10 and 200 microns. The so-called spark-plasma sintering process is especially suitable for sinter bonding or for producing the sinter layer 15, in which the required sintering temperature is produced by current flowing through the sinter material.

Figure 16:
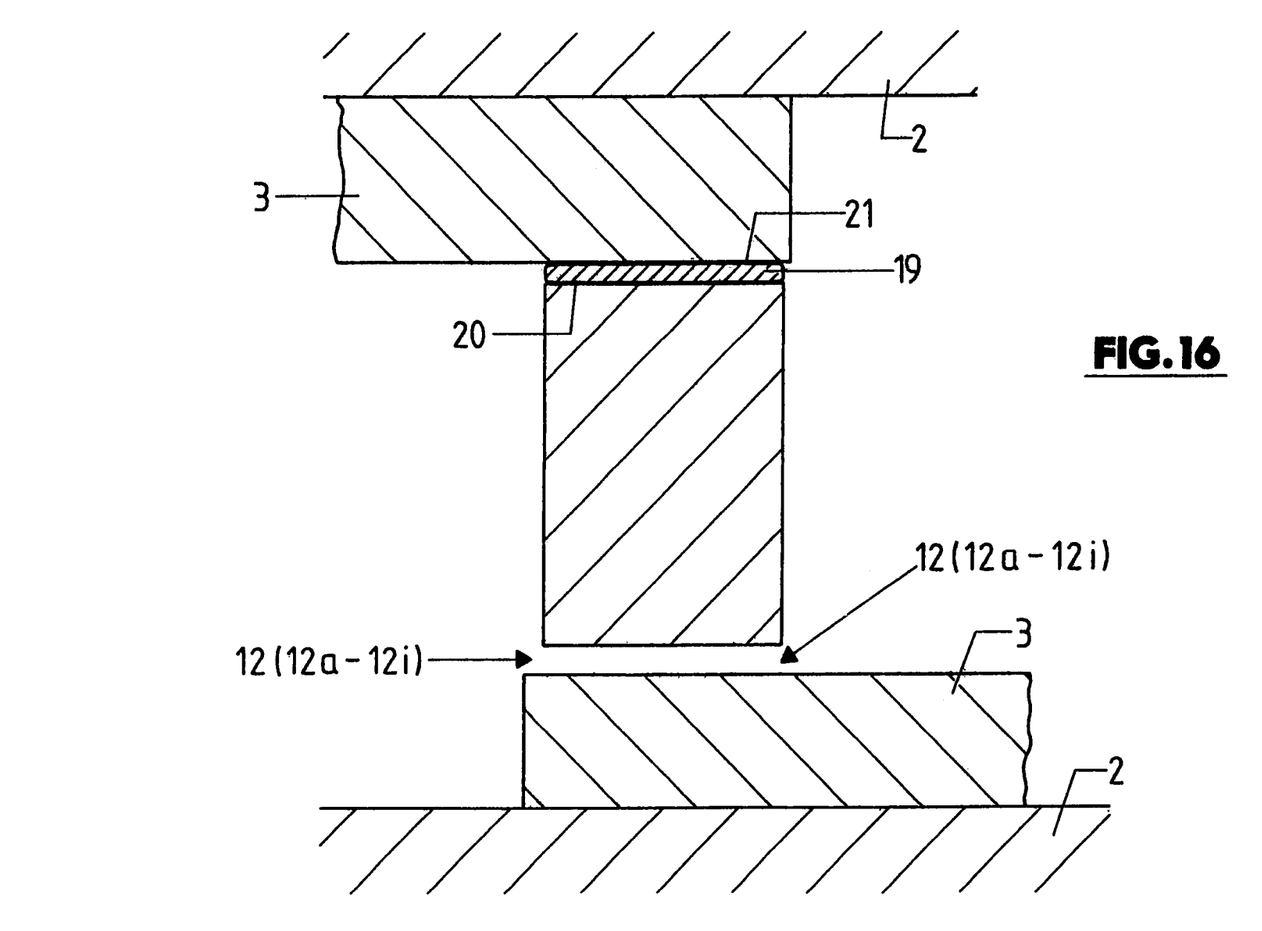
FIG. 16 shows in an enlargement a Peltier element (Peltier chip) which is located between the two contact surfaces.
Figure 17:
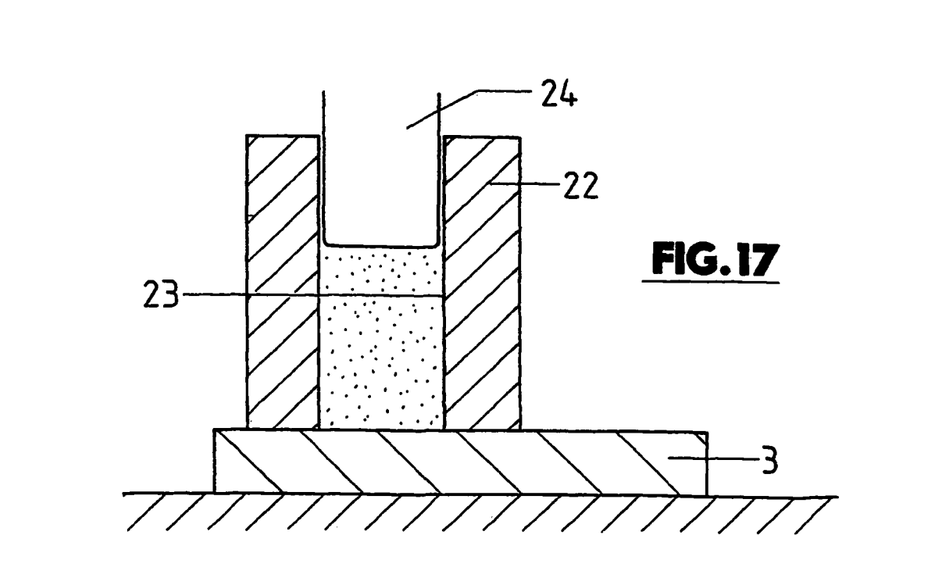
FIG. 17 shows in a simplified representation a process for producing a Peltier element and for simultaneous joining of this element to a contact surface each by sintering in a common sintering process.

It was assumed above in conjunction with FIGS. 15 and 16 that the Peltier elements 4 are each joined only on one terminal surface via the sinter layer 15 or the sinter connection to one contact surface 3 of a ceramic substrate 2, while the connection of the other terminal side to the corresponding contact surface 3 takes place via the solder layer 19, for example a soft solder or brazing solder layer or also via a corresponding sinter connection (sinter bonding). In the corresponding configuration of the process it is of course also possible to connect the two terminal sides of each Peltier element optionally using intermediate layers via one sinter connection to the contact surfaces 3.

Figure 18:
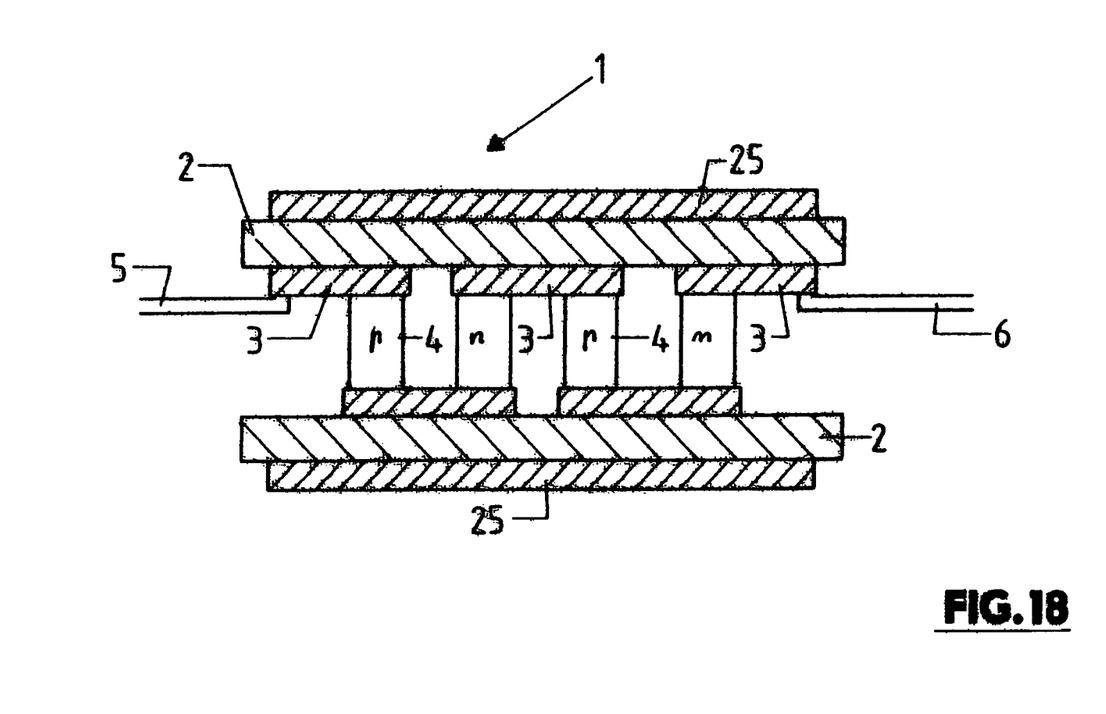
FIG. 18 shows in a representation similar to FIG. 1 a Peltier module according to another possible embodiment of the invention.

FIG. 18 schematically shows a process in which the Peltier elements 4 have not been prefabricated and only then are the ceramic substrates 2 on their contact surfaces 3 provided with the Peltier elements 4 in the described manner, for example using templates or masks, but in this process the Peltier elements 4 are produced by sintering under the action of heat and pressure and in doing so at the same time sintered onto the contact surfaces 3. Production of the respective Peltier element 4 and the joining of this element to a contact surface 3 therefore take place by sintering in the same step. In this process a mask 22 is used which has a plurality of openings 23, of which each forms a shape for producing Peltier elements 4. The mask 22 is placed on one ceramic substrate 2 at a time which has been prepared with contact surfaces 3 such that each opening 23 is located where a Peltier element 4 can be connected to the contact surface 3.

The openings 23 are filled with a powder mixture which is suitable for production of Peltier elements, for example with a mixture of Zn and Sb, of Pb and Te, Bi and Te, AG, Bb, Sb and Te or of Pb, Te, and Se. Using plungers 24 which have been inserted appropriately into the openings 23, and which for example are a component of a stamping tool which is not shown, the powder mixture which has been introduced in the openings 23 is exposed to the sintering pressure and under the action of heat by sintering is shaped into the respective Peltier element 4, and the latter is moreover sintered onto the respective contact surface 3 and joined to it by sinter bonding. In turn, for this process the so-called spark-plasma sintering process is especially suited, in which then the required sintering temperature is produced by the current flowing for example through the respective plunger 4 and the contact surface 3.

In these processes the contact surfaces 3 are formed either by the metal regions 9 or copper layers without an intermediate layer or are provided with one or more intermediate layers. With this process for example the connections 12 and 12a are produced. Production and sinter bonding of the individual Peltier elements 4 take place in turn according to FIG. 15 such that each Peltier element 4 with one terminal side is provided on the contact surface 3 of a ceramic substrate 2 and stands away from this contact surface. Then, according to the position c of FIG. 15 the terminal ends of the Peltier element of each ceramic substrate 2, which end is free until then, are connected to the contact surfaces 3 of a further ceramic substrate 2 via a solder layer 19, for example a soft or brazing solder layer or even a corresponding sinter connection.

When using a special masking and filling technique it is also possible to form all the Peltier elements by sintering on the contact surface 3 of one of the two ceramic substrates of the Peltier module to be produced and to connect them to the contact surfaces 3 so that then in a second process step after cooling the Peltier elements their exposed terminal sides are electrically and mechanically connected to the contact surfaces 3 on the second ceramic substrate 2 of the respective Peltier module, for example in turn by a soft solder or brazing solder layer or by a sinter layer.

Especially for sinter bonding, i.e. for connections which have connections 12b-12i a sinter layer 15, it can be a good idea for the respective ceramic substrate 2 on the surface side facing away from the Peltier elements 4 to be provided with an additional metal layer 25, for example with a copper layer, which then among others increases the strength and reliability of the ceramic substrates 2 during the sintering process, as is shown in FIG. 18 for another embodiment, in which the Peltier elements 4 consist alternately of a material with n-doping and with p-doping, and not, as in the version of FIG. 1, of a n-doped and a p-doped section.

The invention was described above on various embodiments. It goes without saying that numerous changes and modifications are possible without departing from the inventive idea underlying the invention.

REFERENCE NUMBER LIST

1 Peltier module
2 ceramic substrate
3 contact surface
4 Peltier element or chip
5, 6 electrical terminal of the Peltier module
7 metal coating
8 soft solder layer
9 metal region (metal pad or copper pad)
10 soft solder layer
11 nickel layer
12, 12a-12i connection between Peltier element 4 and contact surface 3 or metal pad of the contact surface 3
13 nickel intermediate layer
14 silver and/or gold intermediate layer.
15 sinter layer
16 nickel layer
17 silver and/or gold intermediate layer
18 active solder layer
19 soft solder layer
20, 21 nickel, silver or gold intermediate layer
22 mask
23 opening
24 individual plunger of a stamping tool
25 metal layer or copper layer

What is claimed is:

1. A process for producing Peltier modules with several Peltier elements located between at least two substrates, the at least two substrates being ceramic substrates and at least on their sides being provided with contact surfaces which are formed by metallic regions of copper and to which the Peltier elements are bonded with Peltier element terminal sides in production,
wherein at least one part of the Peltier elements at least on one terminal side is connected to the contact surface by sinter bonding, and wherein production of the at least one part of the Peltier elements and sinter bonding take place in a sintering process using a mask with a plurality of openings, the process further comprising the steps of:
providing metallic regions formed by a copper foil in the at least two substrates by direct copper bonding or active soldering using a brazing solder element selected from the group consisting of Hf, Ti, Zr, Nb and Ce;
placing the mask on one of the at least two substrates, such that the openings of the mask each are located over a contact surface of the substrate;
using a powder mixture of thermo electric material for production of the Peltier elements;
filling the openings of the mask with the powder mixture; and
forming and bonding the Peltier elements to the contact surfaces in the sintering process by exposing the powder mixture in each opening of the mask to a sintering pressure greater than 10 bars and a sintering temperature, wherein sintering or sinter bonding takes place using a spark plasma sintering process.

2. The process as claimed in claim 1, further comprising an additional process step of connecting each of the Peltier elements on its terminal side to one contact surface of a second substrate.

3. The process as claimed in claim 2, wherein connection in the additional process step takes place by soft soldering or brazing.

4. The process as claimed in claim 2, wherein connection in the additional process step takes place by sintering or sinter bonding.

5. The process as claimed in claim 1, wherein sintering or sinter bonding takes place at a sintering temperature below a melting point of the electrical insulating material of the Peltier elements at a sintering temperature over 100° C. and ranging from 30 to 50° C. below the melting point of the electrical insulating material of the Peltier elements.

6. The process as claimed in claim 1, wherein sintering or sinter bonding takes place at a sintering pressure in the range between 10 and 300 bar.

7. The process as claimed in claim 1, wherein sinter bonding takes place using a metallic sinter material.

8. The process as claimed in claim 7, wherein a sinter material is applied such that the sinter connection layer has a thickness in the range between 10-200 microns.

9. The process as claimed in claim 7, wherein copper, silver, a copper-silver alloy, or a combination thereof, is used as the metallic sinter material.

10. The process as claimed in claim 7, wherein the metallic sinter material contains additives, the additives reduce the sintering temperature or sintering pressure.

11. The process as claimed in claim 1, wherein sinter bonding takes place directly onto metal regions which form the contact surfaces.

12. The process as claimed in claim 11, wherein before the sinter bonding, the metal regions which form the contact surfaces or the Peltier elements on the surfaces to be joined are provided with at least one intermediate layer of metal, selected from nickel, silver or gold.

13. The process as claimed in claim 12, wherein the at least one intermediate layer is applied by galvanic or chemical deposition or by application of a material which forms the at least one intermediate layer by means of a paste, a dispersion, or a nanodispersion.

14. The process as claimed in claim 1, wherein the at least two substrates are a ceramic substrate, an aluminum oxide ceramic, an aluminum oxide ceramic with additives of zirconium oxide, an aluminum nitride ceramic or a silicon nitride ceramic.

15. The process as claimed in claim 1, wherein the copper foil is bonded to the at least two substrates by heating at a temperature between 1025° C. and 1083° C.

* * * * *